(12) United States Patent
Co et al.

(10) Patent No.: US 8,680,687 B2
(45) Date of Patent: Mar. 25, 2014

(54) ELECTRICAL INTERCONNECT FOR DIE STACKED IN ZIG-ZAG CONFIGURATION

(75) Inventors: Reynaldo Co, Scotts Valley, CA (US); Grant Villavicencio, Scotts Valley, CA (US); Jeffrey S. Leal, Scotts Valley, CA (US); Simon J. S. McElrea, Scotts Valley, CA (US)

(73) Assignee: Invensas Corporation, San Jose, CA (US)

( * ) Notice: Subject to any disclaimer, the term of this patent is extended or adjusted under 35 U.S.C. 154(b) by 163 days.

(21) Appl. No.: 12/821,454

(22) Filed: Jun. 23, 2010

(65) Prior Publication Data

US 2010/0327461 A1    Dec. 30, 2010

Related U.S. Application Data

(60) Provisional application No. 61/220,986, filed on Jun. 26, 2009.

(51) Int. Cl.
*H01L 23/48* (2006.01)
*H01L 23/52* (2006.01)
*H01L 29/40* (2006.01)

(52) U.S. Cl.
USPC .......................................... 257/777; 438/107

(58) Field of Classification Search
USPC ..................... 257/777, E21.506; 438/107
See application file for complete search history.

(56) References Cited

U.S. PATENT DOCUMENTS

| | | |
|---|---|---|
| 4,323,914 A | 4/1982 | Berndlmaier et al. |
| 4,336,551 A | 6/1982 | Fujita et al. |

(Continued)

FOREIGN PATENT DOCUMENTS

| | | |
|---|---|---|
| DE | 102004039906 A1 | 8/2005 |
| EP | 1041624 A1 | 10/2000 |

(Continued)

OTHER PUBLICATIONS

Notice of Allowance mailed Feb. 27, 2009, U.S. Appl. No. 11/744,153.

(Continued)

*Primary Examiner* — Phuc Dang
(74) *Attorney, Agent, or Firm* — Lerner, David, Littenberg, Krumholz & Mentlik, LLP

(57) ABSTRACT

A die (or of a stack of die) is mounted over and elevated above a support, and is electrically connected to circuitry in the support. Pillars of electrically conductive material are formed on a set of bond pads at a mount side of the support, and the elevated die (or at least one die in the elevated stack of die) is electrically connected to the support, by traces of an electrically conductive material contacting interconnect pads on the die to the pillars, and through the pillars to the support. Also, tiered offset stacked die assemblies in a zig-zag configuration, in which the interconnect edges of a first (lower) tier face in a first direction, and the interconnect edges of a second (upper) tier, stacked over the first tier, face in a second direction, different from the first direction, are electrically connected to a support. Die in the first tier are electrically interconnected die-to-die, and the tier is electrically connected to a support, by traces of an electrically conductive material contacting interconnect pads on the die and a first set of bond pads on the support. Pillars of a electrically conductive material are formed on a second set of bond pads, and die in the second tier are electrically interconnected die-to-die, and the tier is electrically connected to the support, by traces of an electrically conductive material contacting interconnect pads on the die to the pillars, and through the pillars to the substrate.

31 Claims, 12 Drawing Sheets

(56) References Cited

U.S. PATENT DOCUMENTS

| | | |
|---|---|---|
| 4,363,076 A | 12/1982 | McIver |
| 4,500,905 A | 2/1985 | Shibata |
| 4,784,972 A | 11/1988 | Hatada |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,311,401 A | 5/1994 | Gates, Jr. et al. |
| 5,331,591 A | 7/1994 | Clifton |
| 5,434,745 A | 7/1995 | Shokrgozar et al. |
| 5,466,634 A | 11/1995 | Beilstein, Jr. et al. |
| 5,538,758 A | 7/1996 | Beach et al. |
| 5,571,754 A | 11/1996 | Bertin et al. |
| 5,616,953 A | 4/1997 | King et al. |
| 5,691,248 A | 11/1997 | Cronin et al. |
| 5,698,895 A | 12/1997 | Pedersen et al. |
| 5,721,151 A | 2/1998 | Padmanabhan et al. |
| 5,731,631 A | 3/1998 | Yama et al. |
| 5,737,191 A | 4/1998 | Horiuchi et al. |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,030,854 A | 2/2000 | Mashimoto et al. |
| 6,034,438 A | 3/2000 | Petersen |
| 6,087,716 A | 7/2000 | Ikeda |
| 6,107,164 A | 8/2000 | Ohuchi |
| 6,175,158 B1 | 1/2001 | Degani et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,326,689 B1 | 12/2001 | Thomas |
| 6,338,980 B1 | 1/2002 | Satoh |
| 6,351,030 B2 | 2/2002 | Havens et al. |
| 6,472,746 B2 | 10/2002 | Taniguchi et al. |
| 6,476,467 B2 | 11/2002 | Nakamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,355,274 B2 | 4/2008 | Lim |
| 7,405,138 B2 | 7/2008 | Ohuchi et al. |
| 7,408,243 B2 | 8/2008 | Shiffer |
| 7,452,743 B2 | 11/2008 | Oliver et al. |
| 7,514,350 B2 | 4/2009 | Hashimoto |
| 7,521,288 B2 | 4/2009 | Arai et al. |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,888,185 B2 | 2/2011 | Corisis et al. |
| 7,901,989 B2 | 3/2011 | Haba et al. |
| 7,919,846 B2 | 4/2011 | Hembree |
| 7,952,195 B2 | 5/2011 | Haba |
| 8,022,527 B2 | 9/2011 | Haba et al. |
| 8,076,788 B2 | 12/2011 | Haba et al. |
| 2001/0012725 A1 | 8/2001 | Maeda et al. |
| 2001/0031548 A1 | 10/2001 | Elenius et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1* | 12/2002 | Moden et al. ............... 257/686 |
| 2002/0187260 A1 | 12/2002 | Sheppard et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0195667 A1 | 10/2004 | Karnezos |
| 2004/0212083 A1 | 10/2004 | Yang |
| 2004/0217446 A1 | 11/2004 | Headley et al. |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0230802 A1 | 10/2005 | Vindasius et al. |
| 2005/0248021 A1 | 11/2005 | Morkner |
| 2005/0287705 A1 | 12/2005 | Yang |
| 2006/0003552 A1 | 1/2006 | Okada |
| 2006/0035408 A1 | 2/2006 | Derderian |

(56) References Cited

U.S. PATENT DOCUMENTS

| | | |
|---|---|---|
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1* | 7/2007 | Lu et al. ............... 257/686 |
| 2007/0170572 A1 | 7/2007 | Liu et al. |
| 2007/0181989 A1 | 8/2007 | Corisis et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0284044 A1 | 11/2008 | Myers |
| 2008/0303131 A1* | 12/2008 | McElrea et al. ............... 257/686 |
| 2008/0308921 A1 | 12/2008 | Kim |
| 2009/0065948 A1* | 3/2009 | Wang ............... 257/777 |
| 2009/0102038 A1 | 4/2009 | McElrea et al. |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0207277 A1 | 8/2010 | Bauer et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2012/0080807 A1 | 4/2012 | Haba et al. |
| 2012/0133057 A1 | 5/2012 | Haba et al. |
| 2013/0099392 A1 | 4/2013 | McElrea et al. |

FOREIGN PATENT DOCUMENTS

| | | | |
|---|---|---|---|
| EP | 1763894 A2 | 3/2007 | |
| FR | 2704690 A1 | 11/1994 | |
| JP | 07-509104 A | 10/1995 | |
| JP | 2001210782 A | 8/2001 | |
| JP | 2003-142518 A | 5/2003 | |
| JP | 2003163324 A | 6/2003 | |
| JP | 2004153130 A | 5/2004 | |
| JP | 2004158536 A | 6/2004 | |
| JP | 2004-214548 A | 7/2004 | |
| JP | 2006-351793 A | 12/2006 | |
| KR | 20-1994-0004952 | 7/1994 | |
| KR | 10-1999-0008537 | 2/1999 | |
| KR | 20010062722 A | 7/2001 | |
| KR | 20050009036 A | 1/2005 | |
| KR | 20070018057 A | 2/2007 | |
| KR | 100813624 B1 | 3/2008 | |
| KR | 20080045259 A | 5/2008 | |
| KR | 20080069549 A | 7/2008 | |
| WO | 9425987 A1 | 11/1994 | |
| WO | 9907015 A1 | 2/1999 | |
| WO | 9909599 A2 | 2/1999 | |
| WO | 0164344 A2 | 9/2001 | |
| WO | 2005101492 A2 | 10/2005 | |
| WO | 2009052150 A1 | 4/2009 | |
| WO | 2009114670 A2 | 9/2009 | |

OTHER PUBLICATIONS

Office Action (Restriction) mailed Jan. 21, 2010, U.S. Appl. No. 12/046,651.
Amendment filed Feb. 22, 2010 in response to Feb. 21, 2010 Office Action, U.S. Appl. No. 12/046,651.
Office Action mailed Aug. 18, 2010, U.S. Appl. No. 12/046,651.
Amendment filed Jan. 18, 2011 in response to Aug. 18, 2010 Office Action, U.S. Appl. No. 12/046,651.
Ko, et al. Development of three-dimensional memory die stack packages using polymer insulated sidewall technique, 1999.
Office Action mailed Jun. 9, 2010, U.S. Appl. No. 12/251,624.
Amendment filed Dec. 9, 2010 in response to Jun. 9, 2010 Office Action, U.S. Appl. No. 12/251,624.
Final Office Action mailed Mar. 1, 2011, U.S. Appl. No. 12/251,624.
Office Action (Restriction) mailed May 24, 2010, U.S. Appl. No. 12/124,097.
Amendment filed Jun. 26, 2010 in response to May 24, 2010 Office Action, U.S. Appl. No. 12/124,097.
Office Action mailed Oct. 14, 2010, U.S. Appl. No. 12/124,097.
Amendment filed Feb. 14, 2011 in response to Oct. 14, 2010 Office Action, U.S. Appl. No. 12/124,097.
Notice of Allowability, mailed Oct. 19, 2006 U.S. Appl. No. 11/090,969.
Office Action (Restriction) mailed Apr. 20, 2009, U.S. Appl. No. 11/744,142.
Amendment filed May 22, 2009 in response to Apr. 20, 2009 Office Action, U.S. Appl. No. 11/744,142.
Office Action mailed Aug. 3, 2009, U.S. Appl. No. 11/744,142.
Amendment filed Dec. 3, 2009 in response to Aug. 3, 2009 Office Action, U.S. Appl. No. 11/744,142.
Final Office Action mailed Mar. 18, 2010, U.S. Appl. No. 11/744,142.
Notice of Appeal filed Sep. 16, 2010 in response to Mar. 18, 2010 Office Action, U.S. Appl. No. 11/744,142.
Amendment and RCE filed Mar. 16, 2011 in response to Mar. 18, 2010 Office Action, U.S. Appl. No. 11/744,142.
Office Action mailed Feb. 7, 2006, U.S. Appl. No. 11/097,829.
Amendment a filed Aug. 7, 2006 in response to Feb. 7, 2006 Office Action, U.S. Appl. No. 11/097,829.
Final Office Action mailed Jan. 8, 2007, U.S. Appl. No. 11/097,829.
Amendment filed Jan. 24, 2007 in response to Jan. 8, 2007 Office Action, U.S. Appl. No. 11/097,829.
Notice of Allowance, mailed Feb. 12, 2007, U.S. Appl. No. 11/097,829.
Notice to File Corrected Papers, mailed Mar. 30, 2007, U.S. Appl. No. 11/097,829.
Amendment filed May 29, 2007 in response to Mar. 30, 2007 Notice, U.S. Appl. No. 11/097,829.
Office Action (Restriction) mailed Dec. 28, 2010, U.S. Appl. No. 12/403,175.
Office Action mailed Dec. 31, 2007, U.S. Appl. No. 11/744,153.
Amendment filed Apr. 11, 2008 in response to Dec. 31, 2007 Office Action, U.S. Appl. No. 11/744,153.
Final Office Action mailed Jul. 1, 2010, U.S. Appl. No. 11/744,153.
Amendment filed Oct. 1, 2008 in response to Jul. 1, 2010 Office Action, U.S. Appl. No. 11/744,153.
Advisory Action, mailed Oct. 20, 2008, U.S. Appl. No. 11/744,153.
Amendment and RCE filed Nov. 26, 2008 in response to Oct. 20, 2008 Advisory Action, U.S. Appl. No. 11/744,153.
Office Action (Restriction) mailed Oct. 7, 2009, U.S. Appl. No. 12/143,157.
Amendment filed Nov. 9, 2009 in response to Oct. 7, 2009 Office Action, U.S. Appl. No. 12/143,157.
Office Action mailed Dec. 30, 2009, U.S. Appl. No. 12/143,157.
Amendment filed Jun. 30, 2009 in response to Dec. 30, 2009 Office Action, U.S. Appl. No. 12/143,157.
Final Office Action, mailed Aug. 5, 2010, U.S. Appl. No. 12/143,157.

(56) References Cited

OTHER PUBLICATIONS

Amendment and RCE filed Feb. 7, 2011 in repsonse to Aug. 5, 2010 Office Action, U.S. Appl. No. 12/143,157.
Office Action mailed Mar. 1, 2011, U.S. Appl. No. 12/143,157.
Amendment filed Jan. 29, 2010 in response to Dec. 28, 2010 Office Action, U.S. Appl. No. 12/403,175.
Office Action (Restriction) mailed Feb. 4, 2010, U.S. Appl. No. 12/251,624.
Amendment filed Mar. 4, 2010 in response to Feb. 4, 2010 Office Action, U.S. Appl. No. 12/251,624.
International Search Report and Written Opinion for Application No. PCT/US2009/047389 dated Jan. 14, 2010.
International Search Report for Application No. PCT/US2009/067386 dated Jul. 1, 2010.
Written Opinion of the International Searching Authority for Application No. PCT/US2009/067386 dated Jul. 1, 2010.
International Search Report for Application No. PCT/US2010/055472 dated Jul. 27, 2011.
Written Opinion of the International Searching Authority for Application No. No. PCT/US2010/055472 dated Jul. 27, 2011.
U.S. Appl. No. 12/124,097, filed May 20, 2008.
International Search Report mailed Mar. 23, 2009, International Application No. PCT/US2008/74450.
Office Action mailed Dec. 22, 2006, U.S. Appl. No. 11/016,558.
Amendment filed Jun. 21, 2007 in response to Dec. 22, 2006 Office Action, U.S. Appl. No. 11/016,558.
Final Office Action mailed Jul. 19, 2007, U.S. Appl. No. 11/016,558.
Amendment filed Sep. 19, 2007 in response to Jul. 19, 2007 Office Action, U.S. Appl. No. 11/016,558.
Advisory Action mailed Oct. 10, 2007, U.S. Appl. No. 11/016,558.
Response filed Oct. 19, 2007 to Oct. 10, 2007 Advisory Action, U.S. Appl. No. 11/016,558.
Amendment filed Jan. 22, 2007 in response to Jul. 19, 2007 Office Action, U.S. Appl. No. 11/016,558.
Office Action mailed Mar. 27, 2008, U.S. Appl. No. 11/016,558.
Amendment filed Jun. 27, 2008 in response to Mar. 27, 2008 Office Action, U.S. Appl. No. 11/016,558.
Final Office Action mailed Sep. 15, 2008, U.S. Appl. No. 11/016,558.
Amendment filed Oct. 14, 2008 in response to Sep. 15, 2008 Office Action, U.S. Appl. No. 11/016,558.
Office Action mailed Dec. 15, 2008, U.S. Appl. No. 11/016,558.
Amendment filed Apr. 8, 2009 in response to Dec. 15, 2008 Office Action, U.S. Appl. No. 11/016,558.
Office Action mailed Jul. 15, 2009, U.S. Appl. No. 11/016,558.
Response filed Aug. 5, 2009 in response to Jul. 15, 2009 Office Action, U.S. Appl. No. 11/016,558.
Notice of Allowance mailed Dec. 17, 2009, U.S. Appl. No. 11/016,558.
EP Supplemental Search Report mailed Nov. 5, 2007, EP Application No. 05736129.7.
Office Action mailed Mar. 19, 2008, EP Application No. 05736129.
Office Action mailed Jan. 27, 2009, U.S. Appl. No. 11/849,162.
Amendment filed Mar. 27, 2009 in response to Jan. 27, 2009 Office Action, U.S. Appl. No. 11/849,162.
Office Action (Restriction) mailed Jan. 24, 2009, U.S. Appl. No. 11/849,162.
Amendment filed Jul. 8, 2009 in response to Jun. 24, 2009 Office Action, U.S. Appl. No. 11/849,162.
Supplemental Amendement filed Aug. 5, 2009, U.S. Appl. No. 11/849,162.
Office Action (Restriction) mailed Oct. 7, 2009, U.S. Appl. No. 11/849,162.
Amendment filed Nov. 9, 2009 in response to Oct. 7, 2009 Office Action, U.S. Appl. No. 11/849,162.
Office Action mailed Jul. 21, 2010, U.S. Appl. No. 11/849,162.
Amendment filed Jan. 21, 2011 in response to Jul. 21, 2010 Office Action, U.S. Appl. No. 11/849,162.
Ex Parte Quayle Action mailed Feb. 17, 2006, U.S. Appl. No. 11/090,969.
Amendment a filed Aug. 7, 2006 in response to Feb. 7, 2006 Quayle Action, U.S. Appl. No. 11/090,969.
Notice of Allowability, mailed Oct. 19, 2006, U.S. Appl. No. 11/090,969.
EP Supplementary Search Report mailed Jun. 5, 2008, EP App. No. 05735136.3.
International Search Report for PCT Application No. PCT/US2008/065793, mailed Dec. 22, 2008.
International Search Report and Written Opinion for PCT Application No. PCT/US2008/065788, mailed Sep. 30, 2008.
International Search Report & Wrilen Opinion, Application N90. PCT/US2008/066561, dated Dec. 31, 2008.
Amendment filed Jul. 26, 2010 in response to May 24, 2010 Office Action, U.S Appl. No. 12/124,097.
Amendment filed Dec. 3, 2009 in response to 813109 Office Action, U.S. Appl. No. 11/744,142.
Office Action mailed 217106, U.S. Appl. No. 11/097,829.
EP Supplementary Search Report dated Jun. 5, 2008 and mailed Jun. 12, 2008 for EP App. No. 05735136.3.
Amendment filed Oct. 11, 2008 in response to Jul. 11, 2010 Office Action, U.S. Appl. No. 11/744,153.
International Search Report and Wrilen Opinion, Appl. No. PCT/US2008/067722, dated Feb. 25, 2009.
International Search Report and Written Opinion dated Mar. 17, 2009, App. No. PCT/US2008/079948.
International Search Report and Written Opinion dated Mar. 6, 2009, App. No. PCT/US2008/173365.
International Search Report and Written Opinion dated Oct. 6, 2009, App. No. PCT/US2009/36921.
International Search Report and Written Opinion dated Apr. 12, 2010, App. No. PCT/US2009/55421.
International Search Report and Written Opinion dated Jan. 26, 2011, App. No. PCT/US2010/39639.

\* cited by examiner

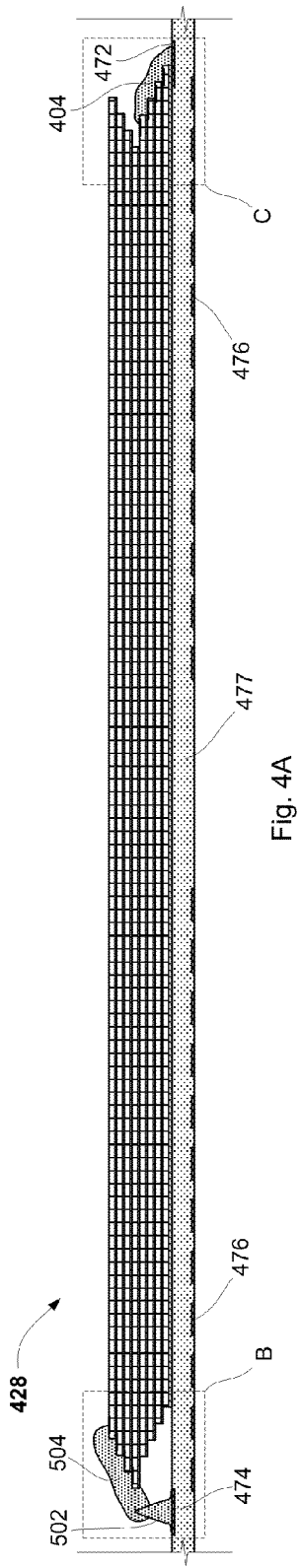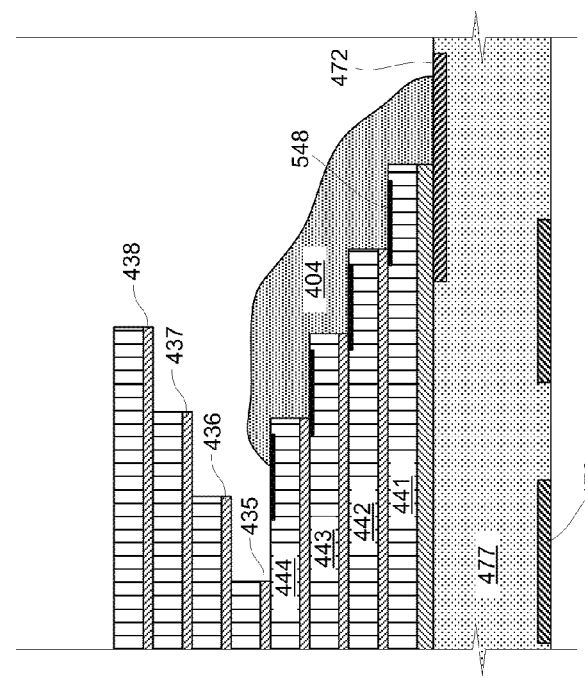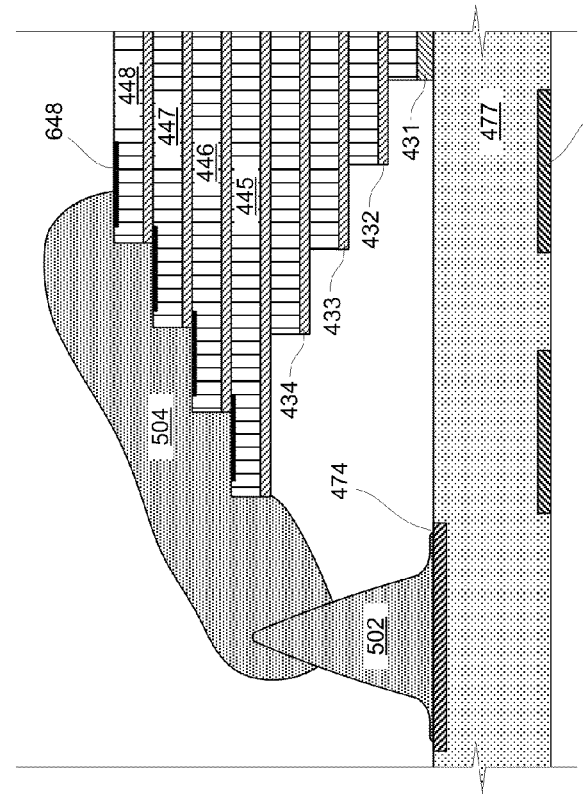

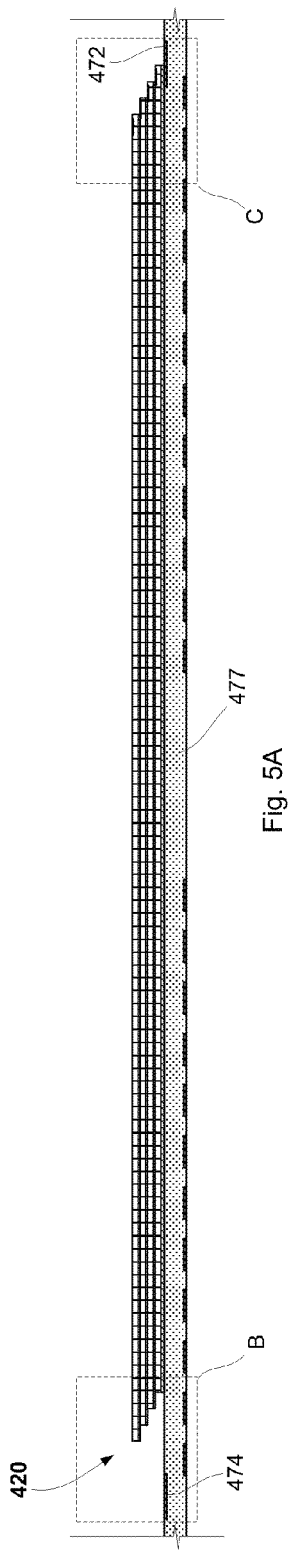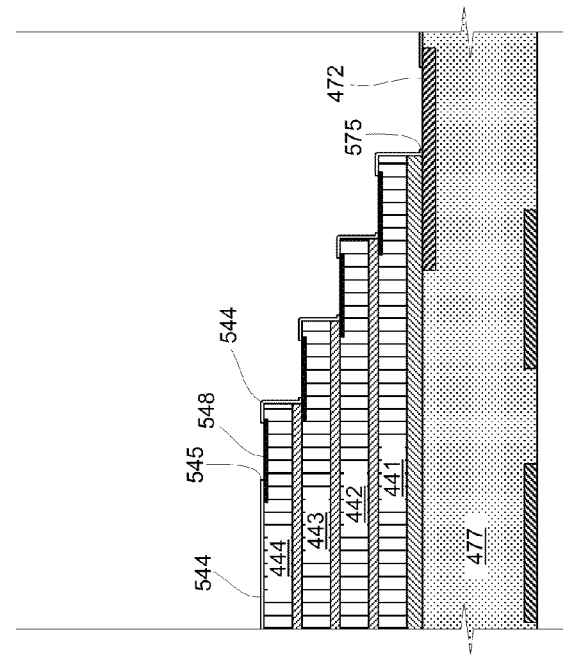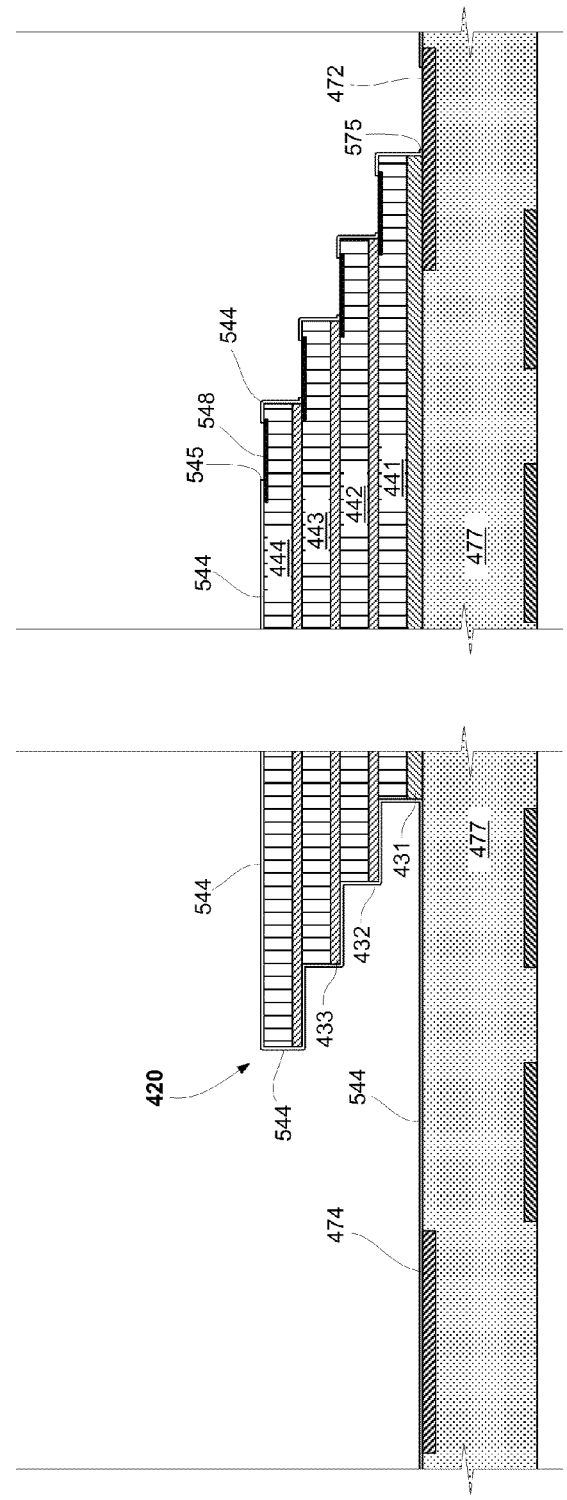

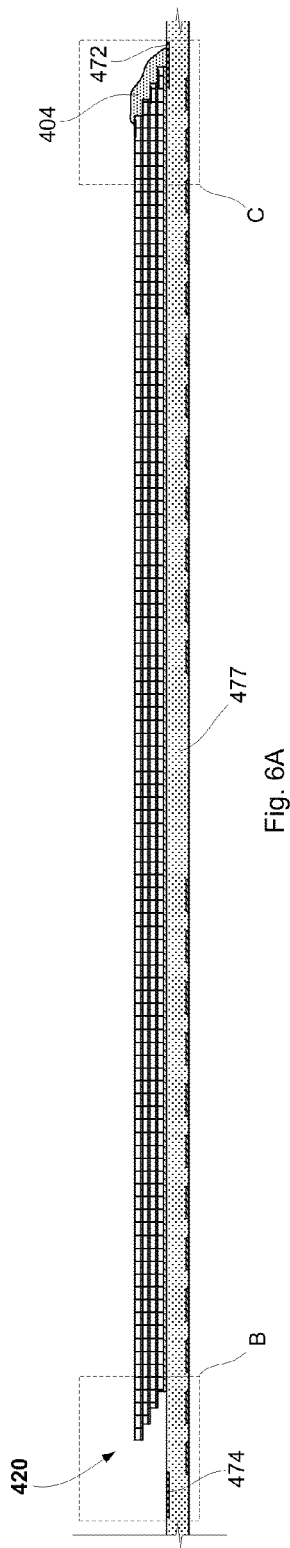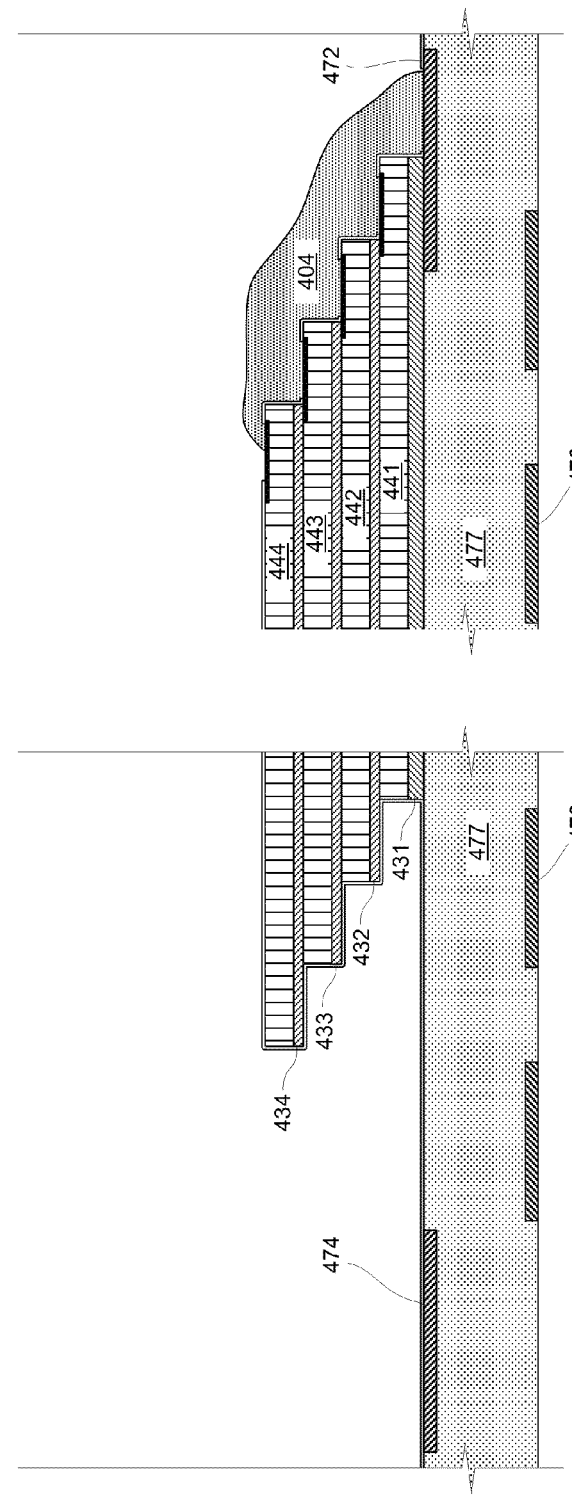

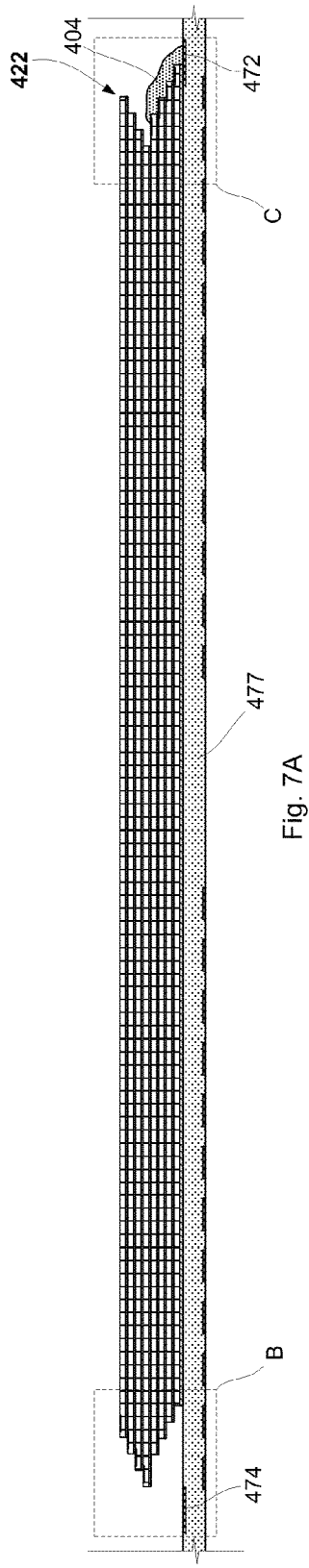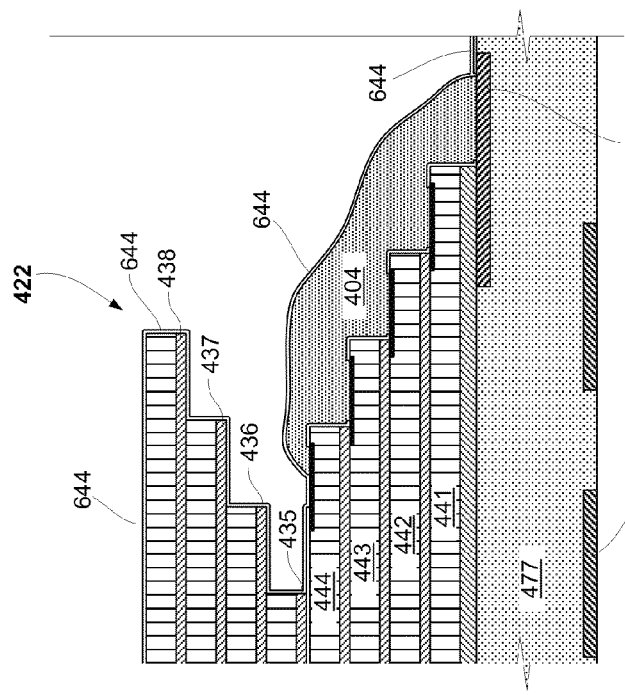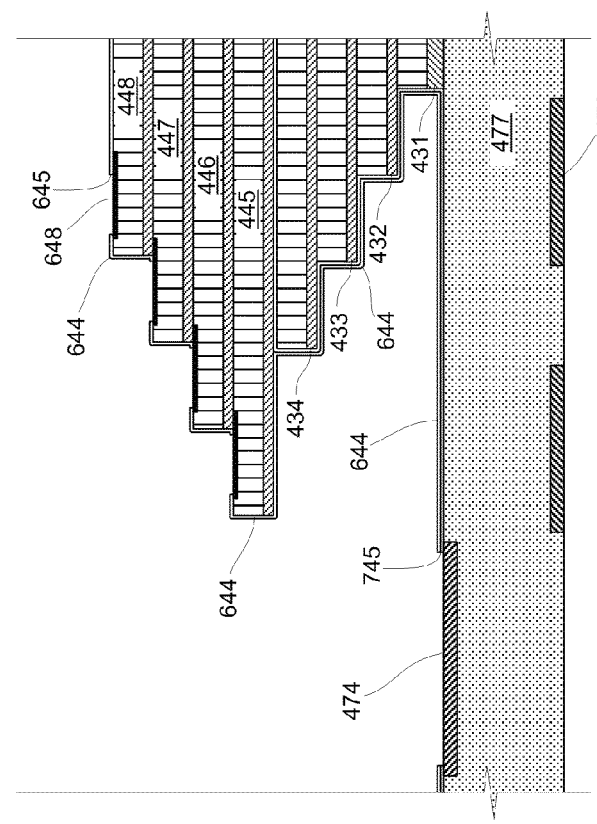

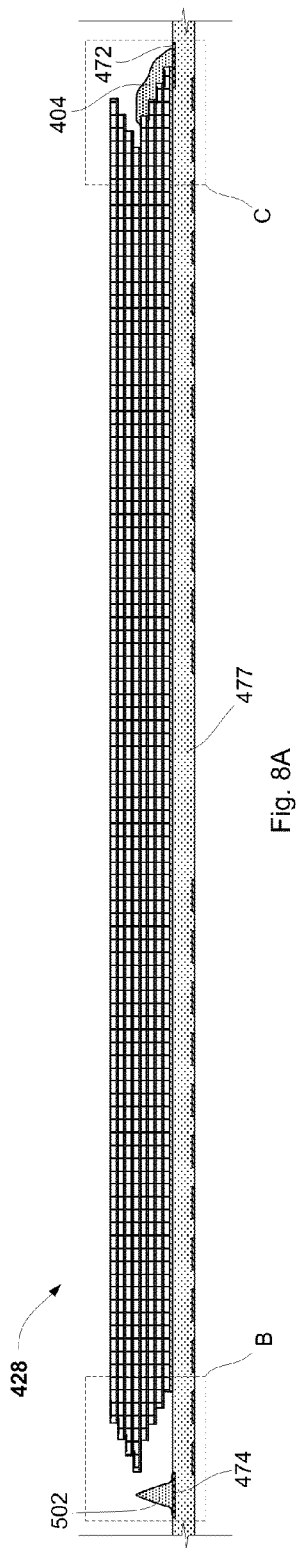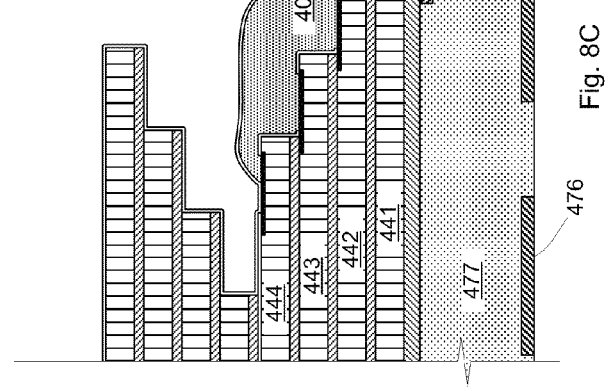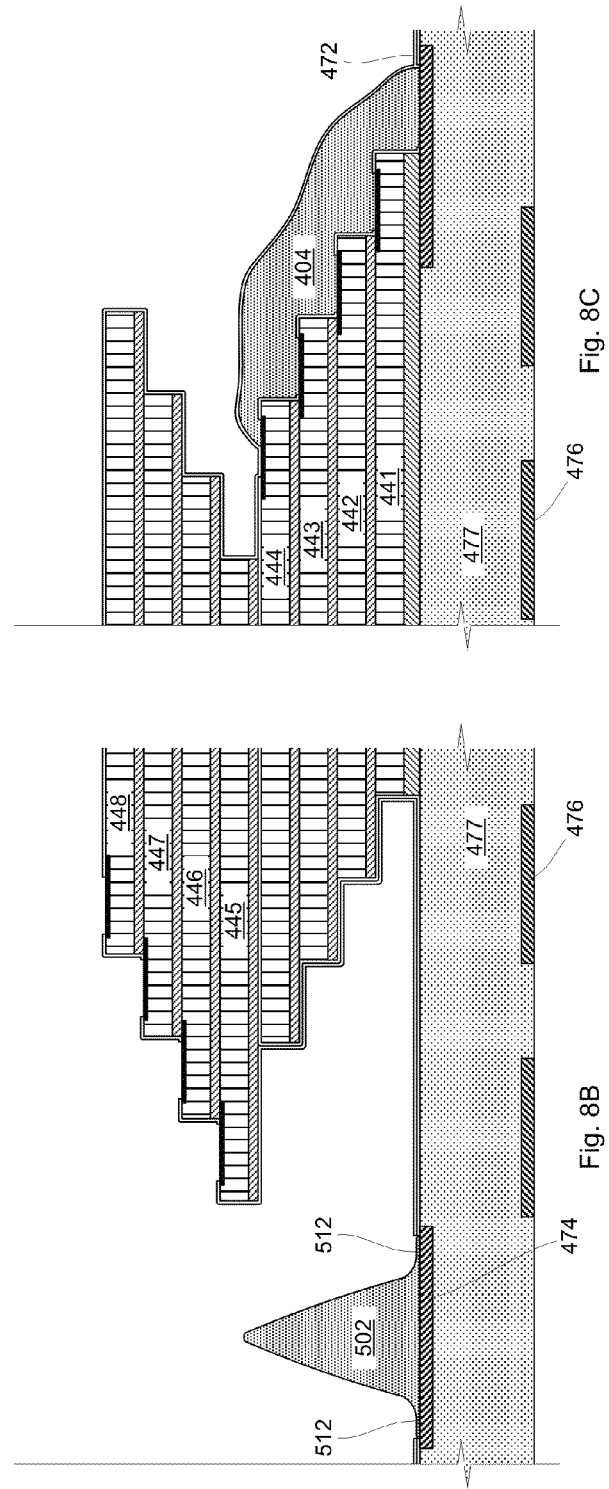

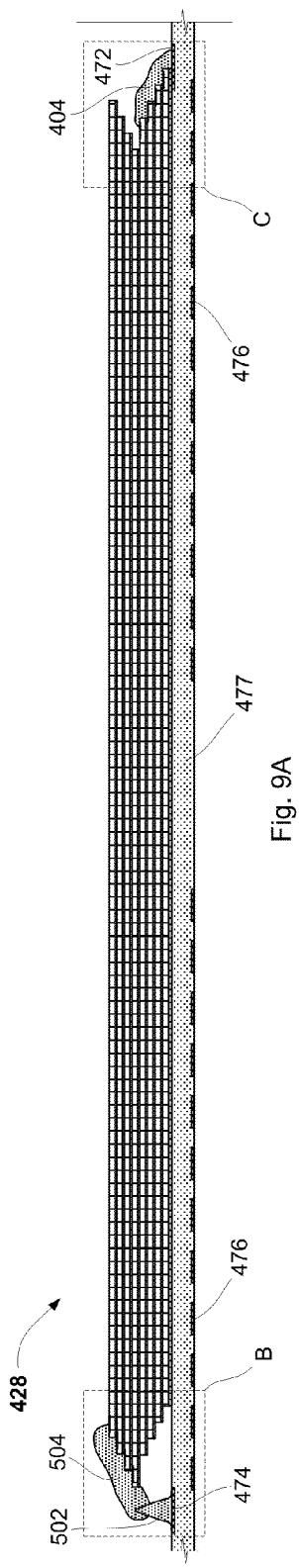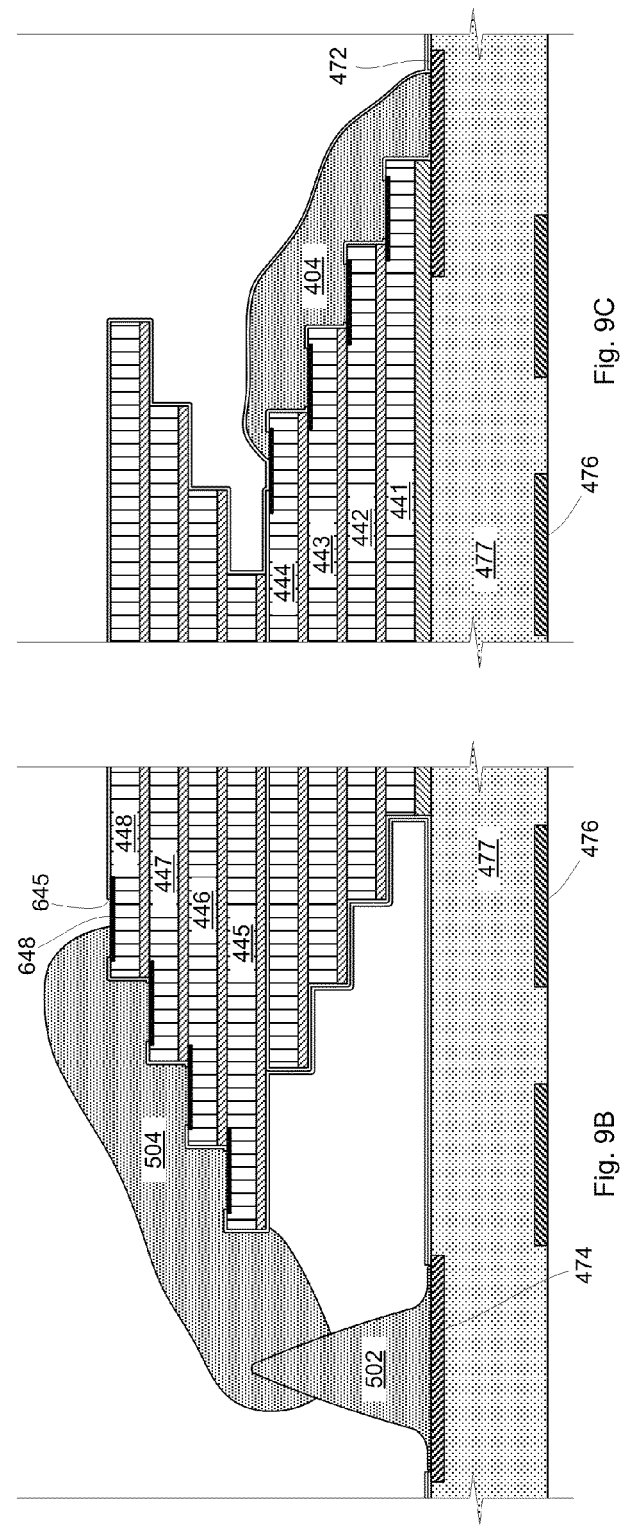

ELECTRICAL INTERCONNECT FOR DIE STACKED IN ZIG-ZAG CONFIGURATION

CROSS-REFERENCE TO RELATED APPLICATIONS

This application claims priority from R. Co et al. U.S. Provisional Application No. 61/220,986, titled "Electrical interconnect for die stacked in zig-zag configuration", which was filed Jun. 26, 2009, and which is hereby incorporated by reference herein.

BACKGROUND

This invention relates to electrical interconnection of integrated circuit chips and, particularly, to electrical interconnection of stacked die.

A typical semiconductor die has a front ("active") side, in which the integrated circuitry is formed, a back side, and sidewalls. The sidewalls meet the front side at front edges and the back side at back edges. Semiconductor die typically are provided with interconnect pads (die pads) located at the front side for electrical interconnection of the circuitry on the die with other circuitry in the device in which the die is deployed. Typically, the die pads consist of an electrically conductive metal or metallization, such as copper or aluminum.

Some die as provided have die pads on the front side along one or more of the die margins, and these may be referred to as peripheral pad die. Other die as provided have die pads arranged in one or two rows on the front side near the center of the die, and these may be referred to as center pad die. Some die have pads arranged in an area array. However the die pads may be arranged in the die as provided, the die may be "rerouted" to provide a suitable arrangement of interconnect pads at or near one or more of the margins of the die.

A number of approaches have been proposed for increasing the density of active semiconductor circuitry in integrated circuit chip packages, while minimizing package size (package footprint, package thickness). In one approach to making a high density package having a smaller footprint, two or more semiconductor die, of the same or different functionality, are stacked one over another and mounted on a package substrate.

S. McElrea et al. U.S. application Ser. No. 12/124,077, filed May 20, 2008, titled "Electrically interconnected stacked die assemblies" describes stacked die configurations in which interconnect pads on the die are electrically connected by traces of an electrically conductive interconnect material. In some configurations adjacent die in the stack are provided with interconnect pads arranged at the front side along a die margin, and the edge at the margin of an overlying die is offset in relation to the margin of the die beneath it. The offset reveals at least a fraction of the area of the interconnect pads on the lower die, so that the pads on the lower die are available for electrical connection with pads on a die situated above. The electrically conductive interconnect material is an electrically conductive polymer, such as a curable conductive epoxy, for example. Larger stacked die assemblies may be made by constructing offset stacked die units in a modular design, and then stacking the units. One such modular unit may be inverted and mounted over another, with the interconnect ends of the respective modular units aligned and connected; the resulting two-tiered assembly presents a zig-zag configuration.

T. Caskey et al. U.S. application Ser. No. 12/124,097, filed May 20, 2008, titled "Electrical interconnect formed by pulse dispense" describes methods for electrical interconnection of die in a stack, and of stacked die with a substrate, by depositing an electrical interconnect material in situ in a series of pulses to form an electrically continuous interconnection. The interconnect material may be a curable material, and may be deposited in an uncured or partially cured state; and the material may be partially or additionally cured at an intermediate stage following dispense, and may be fully cured when dispense has been completed. Suitable interconnect materials include polymers filled with conductive material in particle form such as, for example, metal-filled polymers, including, for example metal filled epoxy, metal filled thermosetting polymers, metal filled thermoplastic polymers, or electrically conductive inks.

SUMMARY

In a general aspect the invention features a die (or of a stack of die) mounted over and elevated above a support, and electrically connected to circuitry in the support. Pillars of electrically conductive material are formed on a set of bond pads at a mount side of the support, and the elevated die (or at least one die in the elevated stack of die) is electrically connected to the support, by traces of an electrically conductive material contacting interconnect pads on the die to the pillars, and through the pillars to the support.

In some embodiments a lower die, or a lower stack of die, or a semiconductor package, is situated between the support and the elevated die; and in some embodiments the lower die or stack of die, or package, is electrically connected to the support. In some embodiments the lower stack of die is a lower tiered offset stacked die assembly, and die in the first tier are electrically interconnected die-to-die, and the lower tier is electrically connected to a support, by traces of an electrically conductive material contacting interconnect pads on the die and a set of bond pads on the support.

In some embodiments the elevated stack of die is a tiered offset stacked die assembly, in which the interconnect edges of the tier of die face in a first direction, and the interconnect die pads are aligned with the pillars.

In various embodiments the invention features tiered offset stacked die assemblies in a zig-zag configuration, in which the interconnect edges of a first (lower) tier face in a first direction, and the interconnect edges of a second (upper) tier, stacked over the first tier, face in a second direction, different from the first direction. The second tier interconnect edge direction may be opposite to or orthogonal to the first tier interconnect edge direction. Die in the first tier are electrically interconnected die-to-die, and the tier is electrically connected to a support, by traces of an electrically conductive material contacting interconnect pads on the die and a first set of bond pads on the support. Pillars of a electrically conductive material are formed on a second set of bond pads, and die in the second tier are electrically interconnected die-to-die, and the tier is electrically connected to the support, by traces of an electrically conductive material contacting interconnect pads on the die to the pillars, and through the pillars to the substrate.

The electrically conductive material includes particles of a metal in a polymer matrix. Suitable materials include materials that can be deposited in a flowable form and thereafter hardened or allowed to harden to form the conductor. The interconnect material may be a curable material, and may be deposited in an uncured or partially cured state; and the material may be partially or additionally cured at an intermediate stage following deposition, and may be fully cured when deposition has been completed. Suitable interconnect materials include polymers filled with conductive material in particle form such as, for example, metal-filled polymers, including, for example metal filled epoxy, metal filled thermosetting polymers, metal filled thermoplastic polymers; and electrically conductive inks.

The interconnect material may be deposited by any technique suitable for the particular material. In some embodiments the material may be dispensed using a nozzle or needle, or sprayed as an aerosol, or screen printed, or jet printed; the material may be continuously dispensed or dispensed in pulses, as for example dropwise through a jet or nozzle.

In another general aspect the invention features a method for electrically connecting a die (or of a stack of die), mounted over and elevated above a support, to circuitry in the support, by: forming pillars of electrically conductive material on a set of bond pads at a mount side of the support, and forming traces of an electrically conductive material, each trace in contact with an interconnect die pad on the elevated die (or on at least one die in the elevated stack of die) and with a pillar. In some embodiments the traces span a gap between the pillars and the interconnect die pads. In some embodiments forming the pillars includes depositing a curable electrically conductive pillar material on a bond pad and curing the deposited pillar material. In some embodiments forming the traces includes depositing a curable electrically conductive trace material in contact with a pillar and curing the deposited trace material. In some embodiments the pillar and trace are formed in a continuous operation.

In another general aspect the invention features a method for making a tiered offset stacked die assembly in a zig-zag configuration, by: stacking or mounting a first (lower) tier on a support, arranged so that the interconnect edges of the first (lower) tier face in a first direction and so that interconnect pads on at least a lowermost die in the first tier are aligned with a first set of bond pads on the support; electrically interconnecting die in the first tier die-to-die, and electrically connecting the tier to the support, by forming first tier traces of an electrically conductive material each in contact with at least one interconnect pad on the die and with one of said first set of bond pads; stacking or mounting a second (upper) tier over the first tier, arranged so that the interconnect edges of the second (upper) tier face in a second direction; forming pillars of electrically conductive material on a second set of bond pads on the support; and forming second tier traces of an electrically conductive material, each trace in contact with an interconnect die pad on at least one die in the second (upper) tier and with a pillar. In some embodiments forming the first tier traces includes depositing a curable electrically conductive trace material in contact with a die pad on at least one lower tier die and with one of a first set of bond pads, and curing the deposited trace material. In some embodiments forming the second tier traces includes forming the traces across a gap between the pillars and the interconnect die pads. In some embodiments forming the pillars includes depositing a curable electrically conductive pillar material on a bond pad and curing the deposited pillar material. In some embodiments forming the second tier traces includes depositing a curable electrically conductive trace material in contact with a die pad on at least one upper tier die and with a pillar, and curing the deposited trace material. The pillars, the first tier traces, and the second tier traces may be formed of the same or of different materials. In embodiments in which the pillars and the second tier traces are formed of the same material, the pillar and trace may be formed separately, or may be formed in a continuous operation.

In some embodiments the method for making a tiered offset stacked die assembly includes, following stacking or mounting the first tier and prior to forming first tier traces, coating the assembly with a conformal dielectric coating and forming openings in at least selected die pads and bond pads to be contacted with the first tier traces. In some embodiments the method for making a tiered offset stacked die assembly includes, following stacking or mounting the second tier and prior to forming the pillars, coating the assembly with a conformal dielectric coating and forming openings in at least selected second tier die pads and bond pads to be contacted with the pillars.

BRIEF DESCRIPTION OF THE DRAWINGS

FIGS. 4A, 4B and 4C are diagrammatic sketches in sectional view showing a tiered offset stacked die assembly in a zig-zag configuration, mounted on and electrically connected to a support.

FIGS. 5A, 5B and 5C; 6A, 6B and 6C; 7A, 7B and 7C; 8A, 8B and 8C; and 9A, 9B and 9C are diagrammatic sketches in sectional view showing stages in a process for constructing a tiered offset stacked die assembly in a zig-zag configuration, mounted on and electrically connected to a support, as in FIGS. 4A, 4B and 4C. FIGS. 4B, 5B, 6B, 7B, 8B and 9B are part-sectional views as indicated at B in FIGS. 4A, 5A, 6A, 7A, 8A, 9A, respectively; and FIGS. 4C, 5C, 6C, 7C, 8C and 9C are part-sectional views as indicated at C in FIGS. 4A, 5A, 6A, 7A, 8A, 9A, respectively.

DETAILED DESCRIPTION

Figure 1A:
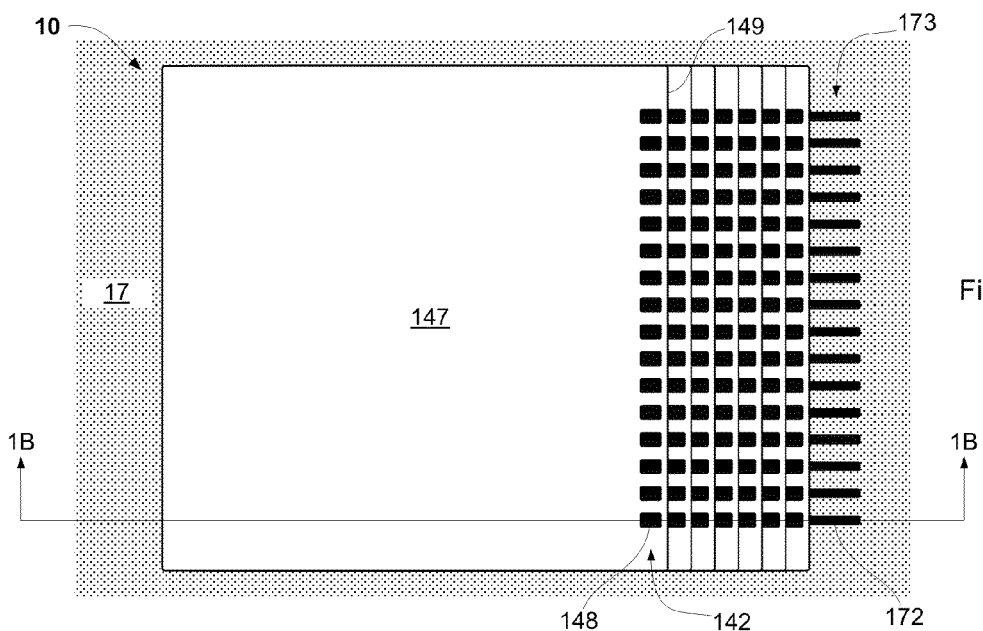
FIGS. 1A and 1B are diagrammatic sketches showing an offset die stack mounted on a support, in plan view (FIG. 1A) and in a sectional view (FIG. 1B).

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention. At some points in the description, terms of relative positions such as "above", "below", "upper", "lower", "top", "bottom" and the like may be used, with reference to the orientation of the views in the drawings; such terms are not intended to limit the orientation of the device in use.

Figure 1B:
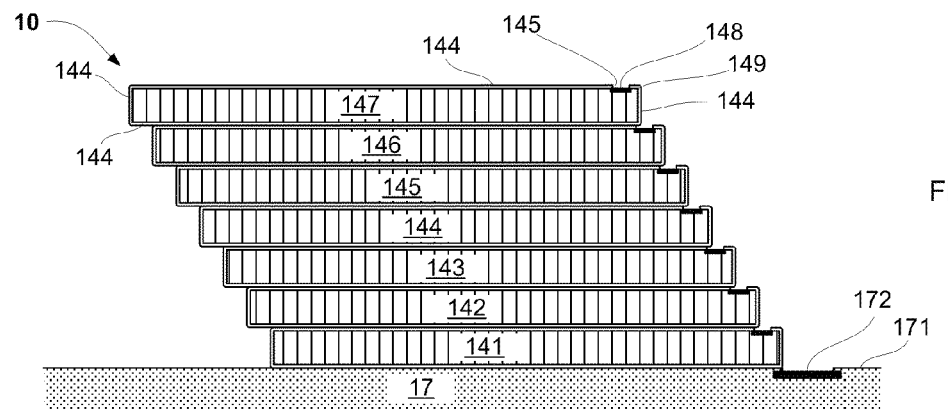

FIG. 1A shows in a plan view an arrangement of offset stacked die 10 mounted on a support, each die having interconnect pads arranged in one margin adjacent a front die edge; and FIG. 1B shows the stack mounted on the support in a sectional view as indicated at 1B-1B in FIG. 1A. In this example the stack includes seven die 141, 142, 143, 144, 145, 146, 147, each mounted with the active side of the die facing away from the support 17. Referring to the uppermost die 147 in the stack, for example, interconnect pads 148 are in this example situated in a row 142 alongside a front die edge 149. The die 147 in this example is covered on all surfaces (back surface, front surface, sidewalls) by an electrically insulative conformal coating 144, provided with openings 145 exposing interconnect pads 148. Successive coated die in the stack may, as in these examples, rest directly one upon another, such that the coating on the back side of an upper die can contact the coating on the front side of the underlying die. In other examples, the conformal coating may cover fewer than all the die surfaces, or it may cover only parts of one or more die surfaces; generally, the electrically insulative conformal coating may be formed at least over surfaces or features that require electrical insulation from other features or surfaces that they may contact in the completed assembly. Optionally, or additionally, a die attach film may be laminated onto the back side of one or more of the die.

In the example shown in FIGS. 1A and 1B each die has interconnect pads situated in a margin along one front die edge (an "interconnect" edge), and succeeding die in the stack are arranged so that their respective interconnect edges face toward the same face of the stack. Successive die in the stack are displaced (offset) in a direction orthogonal to the die edge along which the pads are situated, and in the example shown here the offset leaves the pads in each underlying die fully exposed. This configuration presents as a stairstep die stack, and electrical interconnections are made over the steps.

The stack is mounted on a support 17 (for example, a package substrate) having a row 173 of bond sites 172 exposed at a die mount surface 171. The bond sites are connected to (or constitute a part of) electrical circuitry (not shown in the FIGs.) in the support. The die stack is affixed to the die mount surface 171 of the substrate, and arranged so that the front sidewall of the first (lowermost) die 141 is aligned along the row 173 of bond sites 172. In the example illustrated here, the front sidewall of the lowermost die overlaps the bond sites to a small extent; in other examples, the front sidewall of the lowermost die may be set back from the row of bond sites, or may overlap the bond sites to a greater extent. The coated back side of the first die may, as in these examples, directly contact the support surface 171 and may serve to affix the stack to the support. Optionally, a die attach film may be laminated onto the back side of the first die to serve to affix the stack to the support.

Figure 1C:
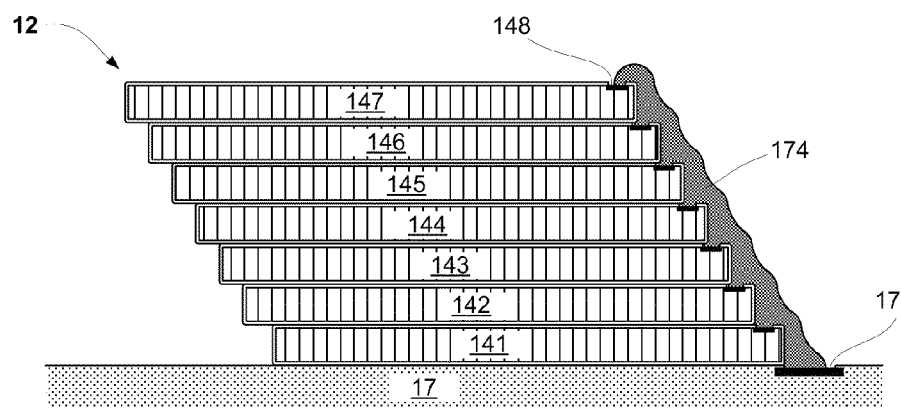
FIG. 1C is a diagrammatic sketch in a sectional view showing an offset die stack mounted on a support, as in FIG. 1B, in which the die are electrically interconnected die-to-die and the die stack electrically connected to the support.

The die are electrically interconnected (die-to-die) in the stack, and the stack is electrically connected to the support, by traces 174 of an interconnect material disposed in contact with die pads, e.g. 148, and bond pads 172, as shown in FIG. 1C. The interconnect material may be an electrically conductive polymer, such as a polymer matrix containing particles of an electrically conductive material. The material may be a curable material, such as a curable polymer, for example, such as electrically conductive epoxy (for example, a silver filled epoxy); and the interconnection may be made by forming traces of the uncured material in a prescribed pattern and thereafter curing the material to secure the electrical contacts with the die pads and the bond sites, and to ensure the mechanical integrity of the traces between them. The material may be an electrically conductive ink, which may include electrically conductive particles in a carrier, and which may or may not include a polymer matrix.

Figure 2A:
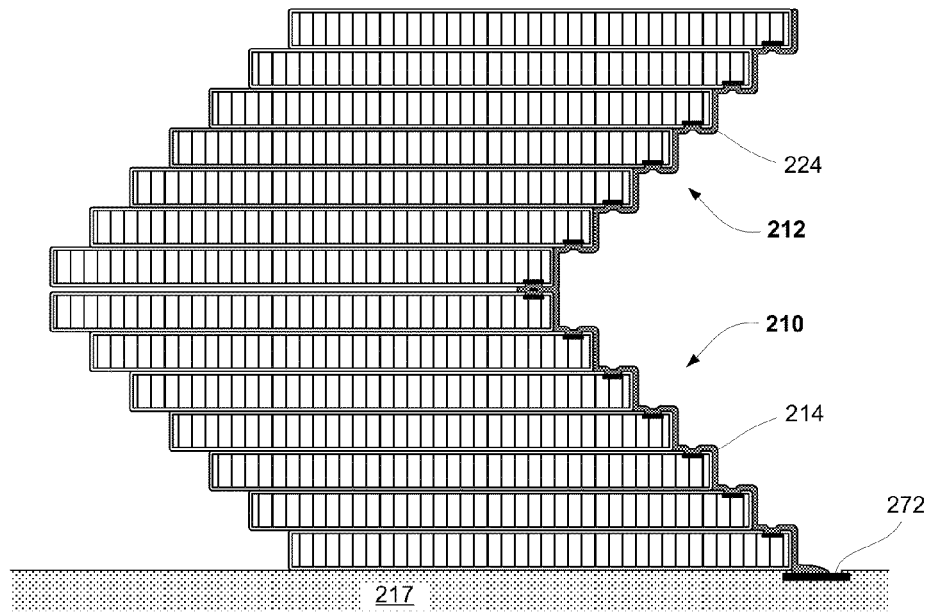
FIGS. 2A and 2B are diagrammatic sketches in sectional view showing two stacked die units mounted one over another in a zig-zag configuration.
Figure 2B:
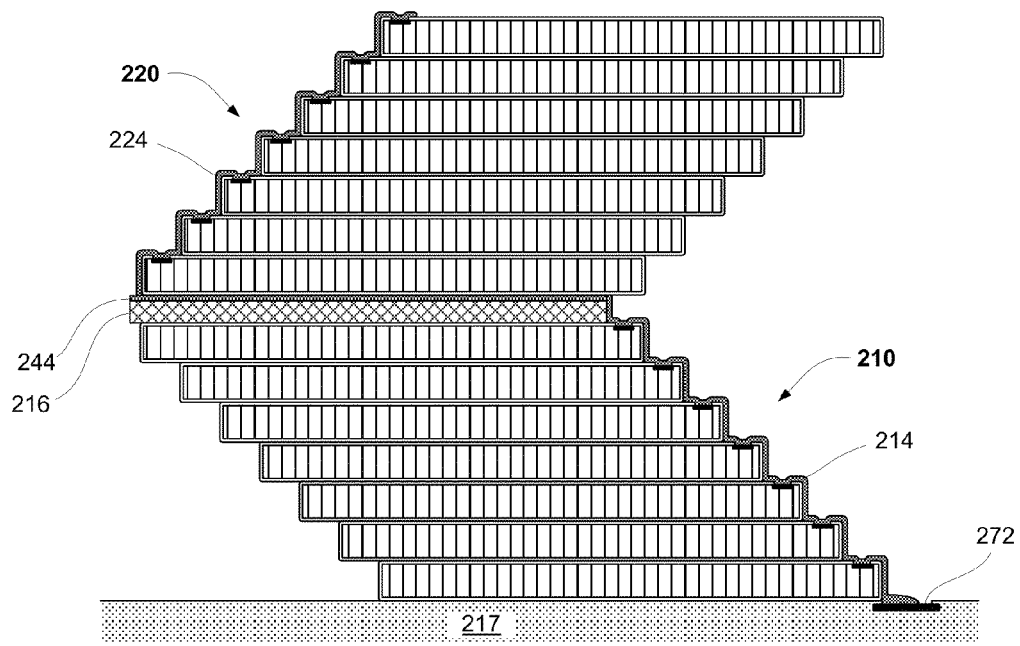

As described in U.S. application Ser. No. 12/124,077, larger stacked die assemblies may be made by constructing offset stacked die units in a modular design, and then stacking the units. One such modular unit may be inverted and mounted over another, with the interconnect ends of the respective modular units aligned and connected; the resulting two-tiered assembly presents a zig-zag configuration, as illustrated for example in FIGS. 2A, 2B. A first offset die stack constitutes a first modular unit (a first tier) 210, which may be mounted onto and electrically connected to bond pads 272 on a support 217; and a second similar modular unit (a second tier) 212 may be inverted and mounted over the first tier 210, with the ends of the interconnects 214, 224 of the respective modular units aligned and connected. A resulting assembly is shown by way of example in FIG. 2A. A spacer may be provided (not shown in FIG. 2A) between the first and second tiers. As may be appreciated, where the first and second modular units are identical, when the second unit is inverted the respective rows of pads at the interconnect ends are antiparallel; that is, a first interconnect on the first unit is now aligned with a last interconnect on the second die. In such configurations, rerouting circuitry may be required, to connect the appropriate respective features on the die. Rerouting circuitry may be provided at the active side of the top die of the first unit; or, where a spacer is included, the spacer may constitute an interposer (not shown in FIG. 2A), including one or more dielectric layers and one or more conductive rerouting layers. FIG. 2B shows a configuration in which a second tier is mounted over a first tier, but is not inverted. Here the ends of the interconnects 224 of the second tier 220 are near the opposite edge of the top die in the first tier 210. An interposer, including at least one dielectric layer 216 (such as glass, for example) and at least one patterned conductive layer 244 is situated between the modular units, to provide rerouting from the ends of the interconnects 214 on one edge of the first tier 210 to the ends of the interconnects 224 on the (oppositely situated) edge of the second tier 220.

Rheological properties (such as viscosity, or thixotropy, for example) of particular interconnect materials may be exploited to provide deposits having controlled shapes. Particularly, for some materials a portion of a deposit mass may remain in contact with the deposition tool for a time following completion of a dispense pulse, and the tool may be moved before separation is complete. A conductive polymer material having higher viscosity and thixotropy in the uncured state can be shaped during deposition by moving the deposition tool immediately following a dispense pulse, to draw a "tail" of material in a selected direction to form an interconnect having a selected shape. As a result, the shape of the deposited mass may be determined to some degree by the direction and rate of movement of the tool as well as the rheologic properties of the material.

As noted above, the offset die stacks in the examples shown in FIGS. 1A, 1B, 1C, 2A and 2B are shown as having seven die. Offset stacks having other number of die are contemplated and, typically, an even number of die (for example, four die or eight die per offset stack) may be more usual.

Figure 3A:
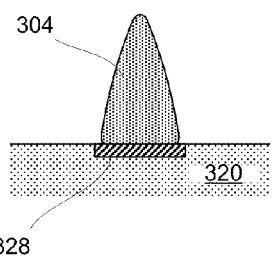
FIG. 3A is a diagrammatic sketch showing a free standing droplet of curable interconnect material.

Referring to FIG. 3A, for example, a droplet 304 is shown attached to an electrical contact 328 on a support 320 (such as a pad on a die, or a bond pad on a substrate). In the example shown, during formation of the droplet, the tool tip (not shown in the FIG.) was directed toward the contact 328, and a mass of material was dispensed onto the contact. Then, while the mass of material was still in contact with the tool tip, the tool was moved perpendicularly away from the target to draw a "tail" of material upward. Eventually the droplet mass separated from the tool tip, and the resulting droplet 304 has a generally conical shape. Materials suitable for forming shaped droplets include electrically conductive epoxies (metal-filled epoxies) having, in the uncured state, a viscosity about 30,000 cps or greater and/or a thixotropic index about 6.5 or greater. As will be appreciated, the viscosity and/or thixotropy must not be too high, or else the material may be unworkable, or it may not make good contact with the interconnect terminals.

U.S. application Ser. No. 12/124,097, referenced above and incorporated by reference herein, describes forming a series of such roughly conical free standing droplets one over another adjacent a die stack face, providing a column of material contacting the interconnect terminals. Such a columnar configuration may be particularly useful where there is a significant space between vertically adjacent die, so that the interconnect trace must vertically traverse the space without lateral support. This may be presented in die stacks having a number of die mounted over one another and separated by spacers; or by a staggered arrangement of die (that is, where the space between the die to be connected approximates (or somewhat exceeds) the thickness of an interposed offset die; or in die stacks having elongated stacked die each oriented 90° to the die below, as described in U.S. application Ser. No. 12/124,077, referenced above and incorporated by reference herein.

Figure 3B:
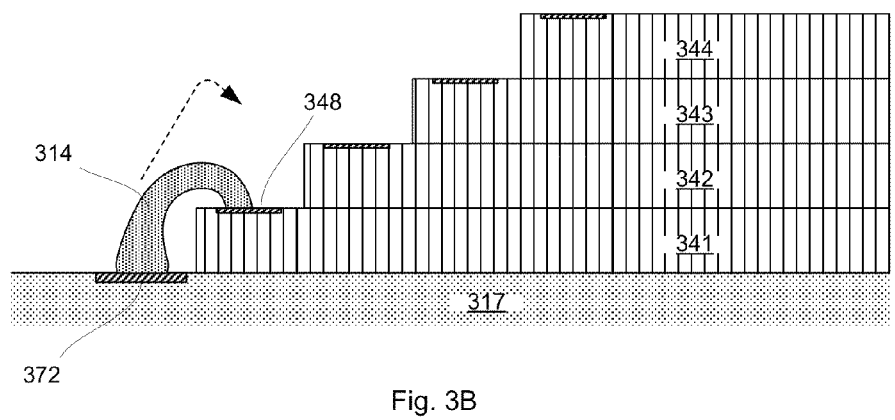
FIG. 3B is a diagrammatic sketch showing a stage in a process for forming electrical interconnects between a die and a support.

As further described in U.S. application Ser. No. 12/124,097, the tool can be moved in other directions than vertically away from the target, and various useful droplet shapes can result. Referring for example to FIG. 3B, an offset stack of die 341, 342, 343, 344 is shown mounted on a substrate 317 having an electrical connection site (such as a bond pad) 372 in the stack mount side. All the die in this example have peripheral pads, e.g., 348, arranged in an interconnect margin along an edge of the die. Each die in the stack is displaced with respect to the die beneath, to expose at least a portion of the area of the pads (exposing the entirety of the pads in the example shown). A first interconnect droplet 314 is shown connecting the die pad 348 on the first die 341 to the bond pad 372 in the substrate 317. To form the droplet, the tool was directed toward the first target bond pad 372, and a mass of material was dispensed onto the bond pad. Then, while the mass of material was still in contact with the tool tip, the tool was moved, first upwardly and laterally away from the first target and then downwardly and laterally toward the die pad 348 (as indicated by the broken arrow) to draw a "tail" of material in an arc toward the second pad. Second and subsequent droplets can be similarly formed to connect pads on the successive die, forming a die-to-die interconnection.

A tiered offset stacked die assembly in a zig-zag configuration, mounted on and electrically connected to a support according to an embodiment of the invention is shown in FIGS. 4A, 4B and 4C. In this example a stacked die assembly 428, including two tiers each having four offset stacked die, is mounted on a support (such as a package substrate) 447. In this example the lower tier includes die 441, 442, 443, 444; and the upper tier includes die 445, 446, 447, 448. The backside of each die is laminated with a die attach film (respectively, 431, 432, 433, 434, 435, 436, 437, 438). Interconnect die pads (e.g., 548; 648) are arranged in a die margin near an interconnect edge of each die. Traces 404 of an interconnect material are formed over the interconnect face of the first tier, contacting interconnect die pads (e.g., 548) to make die-to-die interconnection, and contacting bond pads 472 in a first row on the support to make tier-to-support electrical connection. Pedestals 502 of an interconnect material are formed in contact with bond pads 474 in a second row on the support; and traces 504 of an interconnect material are formed over the interconnect face of the second tier, contacting interconnect die pads (e.g., 648) to make die-to-die interconnection, and contacting pedestals 502 to make tier-to-support electrical connection.

The substrate 477 includes lands 476 at a surface opposite the stack mount surface, for second-level electrical connection (for example as a land grid array or a ball grid array or a tab array) of the assembly to underlying circuitry in a device (not shown in these FIGs.) in which the assembly is deployed for use. The bond pads 472, 474 and the lands 476 are connected to (or constitute parts of) patterned conductive layers, separated by one or more dielectric layers, in the substrate, and the patterned conductive layers in the substrate are connected by vias through the dielectric layer or layers.

Stages in an example of a process for constructing a tiered offset stacked die assembly in a zig-zag configuration, mounted on and electrically connected to a support as shown in 4A, 4B and 4C, are shown in FIGS. 5A, 5B and 5C; 6A, 6B and 6C; 7A, 7B and 7C; 8A, 8B and 8C; and 9A, 9B and 9C. A description of such a process follows.

Conventionally semiconductor circuitry for an array of die is formed in an active side (front side) of a semiconductor wafer. The wafer is thinned, typically by backgrinding, and a die attach film is mounted onto the back side of the thinned wafer. Then the die are singulated by cutting (for example, by sawing) along the saw streets between the die in the array.

The singulated die are stacked, using a tool such as a pick-and-place tool, in the offset arrangement. In the example illustrated here, a first offset stack of die (in this example, four die) constituting a first tier 420 is mounted onto a stack mount surface of the substrate 477. The first tier is situated so that the die attach sidewall of the lowermost die 441 is aligned with (adjacent to, or partially overlapping) the bond pads 472 in the first bond pad row on the substrate. Thereafter the assembly is coated with a dielectric coating 544. The material of the dielectric coating may be any of a variety of materials, and may be formed using any of a variety of techniques as appropriate for the particular material. Suitable materials include organic polymers, and particularly suitable materials include parylenes, which are formed by in situ polymerization of precursor molecules in vapor form. The coating covers all surfaces that are exposed to the material during the coating process, including areas where electrical connection is to be made. Accordingly, openings are formed over selected areas, for example by selective laser ablation. For example, openings 545 are formed through the coating to expose interconnect die pads (e.g., 548) and to expose bond pads (e.g., 472)

in the first row on the substrate. A resulting construct is shown in FIG. 5A, and in partial views, enlarged, in FIGS. 5B, 5C.

Interconnection of the die in the first tier 420 and connection of the first tier to the substrate is thereafter made by forming traces 404 of an electrically conductive material in contact with interconnect die pads and with the bond pads 472. A resulting construct is shown in FIG. 6A, and in partial views, enlarged, in FIGS. 6B, 6C. The dielectric coating serves to insulate features that may be contacted by the electrically conductive traces, but to which electrical contact is not desired, such as the die margins along which the die pads are situated, and the adjacent die edges and sidewalls. As noted above, the electrically conductive material includes materials that can be deposited in a flowable form and thereafter hardened or allowed to harden to form the conductor. The electrically conductive material may be a curable material, and may be deposited in an uncured or partially cured state; and the material may be partially or additionally cured at an intermediate stage following deposition, and may be fully cured when deposition has been completed. Suitable electrically conductive materials include polymers filled with a conductive material in particle form such as, for example, metal-filled polymers, including, for example metal filled epoxy, metal filled thermosetting polymers, metal filled thermoplastic polymers, and electrically conductive inks.

The interconnect material may be deposited by any technique suitable for the particular material. In some embodiments the material may be dispensed using a nozzle or needle, or sprayed as an aerosol, or screen printed, or jet printed; the material may be continuously dispensed or dispensed in pulses, as for example dropwise through a jet or nozzle. Following dispense, the material is cured to complete the interconnection.

Thereafter a second offset stack of die (four die in this example) constituting a second tier 422 is mounted onto the upper surface of the first tier 420. The second tier is situated in this example so that the die attach sidewall of the lowermost die 445 overhangs the first tier, and is vertically aligned in relation to the bond pads 474 in the second bond pad row on the substrate. The resulting assembly is thereafter coated with a second dielectric coating 644. The material of the second dielectric coating may be any of a variety of materials, and may be formed using any of a variety of techniques as appropriate for the particular material. The second coating material may be the same as, or different from, the first coating material. Suitable materials include organic polymers, and particularly suitable materials include parylenes, which are formed by in situ polymerization of precursor molecules in vapor form. The coating covers all surfaces that are exposed to the material during the coating process, including areas where electrical connection is to be made. Accordingly, openings are formed over selected areas, for example by selective laser ablation. For example, openings 645 are formed through the coating to expose interconnect die pads (e.g., 648) and to expose bond pads (e.g., 474) in the second row on the substrate. A resulting construct is shown in FIG. 7A, and in partial views, enlarged, in FIGS. 7B, 7C.

Thereafter pedestals 502 of conductive material are formed in contact with the bond pads 474 in the second row on the substrate. A resulting construct is shown in FIG. 8A, and in partial views, enlarged, in FIGS. 8B, 8C. As noted above, the electrically conductive material includes materials that can be deposited in a flowable form and thereafter hardened or allowed to harden to form the conductor. The electrically conductive material may be a curable material, and may be deposited in an uncured or partially cured state; and the material may be partially or additionally cured at an intermediate stage following deposition, and may be fully cured when deposition has been completed. Suitable electrically conductive materials include polymers filled with a conductive material in particle form such as, for example, metal-filled polymers, including, for example metal filled epoxy, metal filled thermosetting polymers, metal filled thermoplastic polymers, and electrically conductive inks. Suitable materials are selected as having rheological properties suitable to maintain the pedestal height and general shape as dispensed and prior to final cure. In particular embodiments the pedestals have a generally conical shape, having a height in a range about 190-310 um, and a base diameter in a range about 160-180 um, for example. Pedestals having greater height-to-diameter proportions may be made, depending upon the properties of the materials. An epoxy "bleed" surrounding the base, as illustrated at 512 in FIG. 8B, may result during the deposition and cure process; in some embodiments this may not be a desirable feature.

Particular examples of suitable materials for the conductive pedestals include the electrically conductive pastes marketed as the "800, 700, 500, 400, 200 series inks" by Ormet Circuits, Inc. These include 5-15 wt % of an epoxy resin mixture, and up to 5 wt % of butyl carbitol; with the remainder including various proportions of particles of Cu, Bi, Sn and Ag.

Other particular examples of suitable materials for the conductive pedestals include materials marketed as "die attach adhesives" by Lord Corporation, such as the "Thermoset MD-141". These include about 10 wt % of a phenolic novolac resin, about 5 wt % of a glycol ether compound, about 10 wt % of an epoxy resin, and about 80 wt % of silver.

The interconnect material for the pedestals may be deposited by any technique suitable for the particular material and pedestal shape. In some embodiments the material may be dispensed using a nozzle or needle or screen printed, or jet printed; the material may be continuously dispensed or dispensed in pulses, as for example dropwise through a jet or nozzle. Following dispense the material of the pedestals is cured to complete the mechanical integrity of the pedestals.

Thereafter interconnection of the die in the second tier 422 and connection of the second tier to the substrate (by way of the pedestals 502) is made by forming traces 504 of an electrically conductive material in contact with interconnect die pads and with the pedestals 502. A resulting construct is shown in FIG. 9A, and in partial views, enlarged, in FIGS. 9B, 9C. The dielectric coating serves to insulate features that may be contacted by the electrically conductive traces, but to which electrical contact is not desired, such as the die margins along which the die pads are situated, and the adjacent die edges and sidewalls. As noted above, the electrically conductive material includes materials that can be deposited in a flowable form and thereafter hardened or allowed to harden to form the conductor. The electrically conductive material may be a curable material, and may be deposited in an uncured or partially cured state; and the material may be partially or additionally cured at an intermediate stage following deposition, and may be fully cured when deposition has been completed. Suitable electrically conductive materials include polymers filled with a conductive material in particle form such as, for example, metal-filled polymers, including, for example metal filled epoxy, metal filled thermosetting polymers, metal filled thermoplastic polymers, and electrically conductive inks. Suitable materials are selected as having rheological properties suitable to maintain its shape spanning the gap between the sidewall of the die 445 and the tip of the pedestal, following dispense and prior to final cure.

The interconnect material may be deposited by any technique suitable for the particular material. In some embodiments the material may be dispensed using a nozzle or needle, or sprayed as an aerosol, or screen printed, or jet printed; the material may be continuously dispensed or dispensed in pulses, as for example dropwise through a jet or nozzle.

Figure 10A:
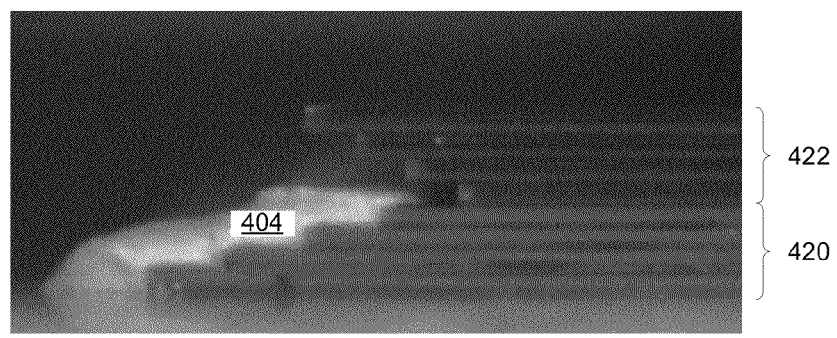
FIG. 10A is an elevational view of part of a tiered offset stacked die assembly mounted on a support, showing electrical connection of the lower tier to the support.
Figure 10B:
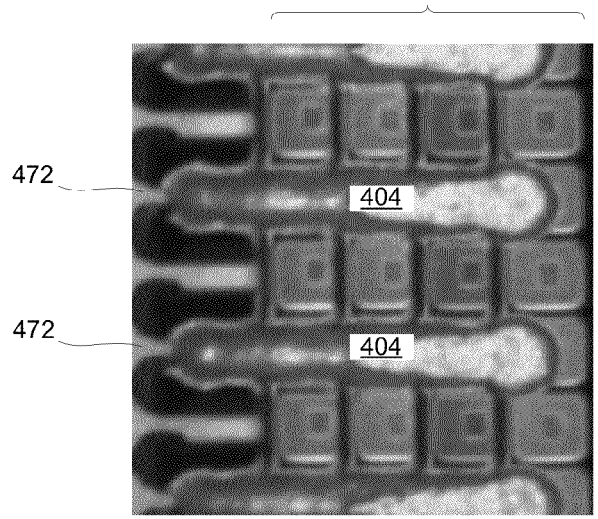
FIG. 10B is a plan view of part of a lower tier of a tiered offset stacked die assembly mounted on a support, showing electrical connection of the lower tier to the support.

FIGS. 10A and 10B are partial views showing the conductive traces 404 making die-to-die interconnection of the die in the first tier 420, and connection of the first tier 420 to the bond pads 472 on the substrate.

Figure 11A:
FIG. 11A is an elevational view of part of a tiered offset stacked die assembly mounted on a support, showing electrical connection of the upper tier to the support.
Figure 11B:
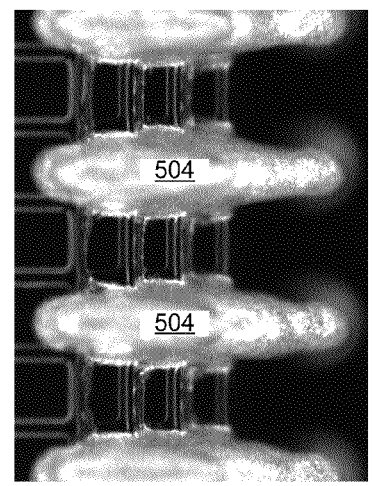
FIG. 11B is a plan view of part of a tiered offset stacked die assembly mounted on a support, showing electrical connection of the upper tier to the support.

FIGS. 11A and 11B are partial views showing the conductive traces 504 making die-to-die interconnection of the die in the second tier 422, and connection of the second tier 422 to the pedestals 502 on the substrate.

Figure 12A:
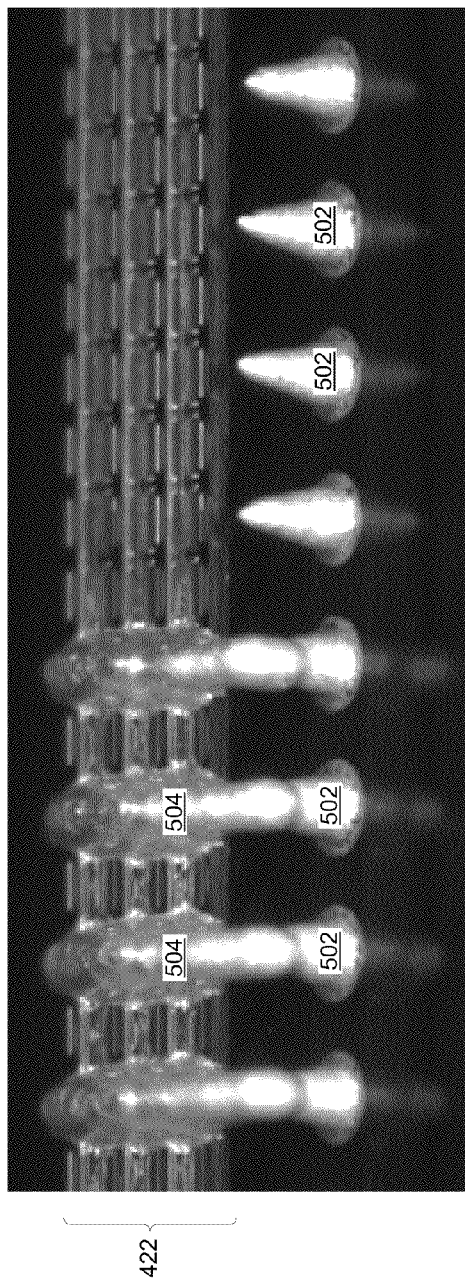
FIG. 12A is an elevational view of part of a tiered offset stacked die assembly mounted on a support, showing a stage in a process for forming electrical connection of the upper tier to the support.
Figure 12C:
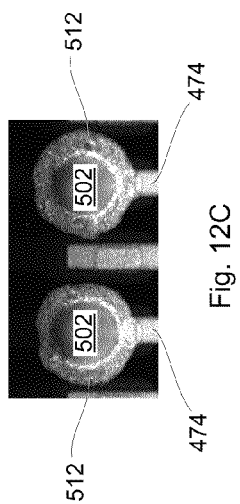
FIG. 12C is a plan view of part of a tiered offset stacked die assembly mounted on a support as in FIG. 12A, showing a stage in a process for forming electrical connection of the upper tier to the support.
Figure 12B:
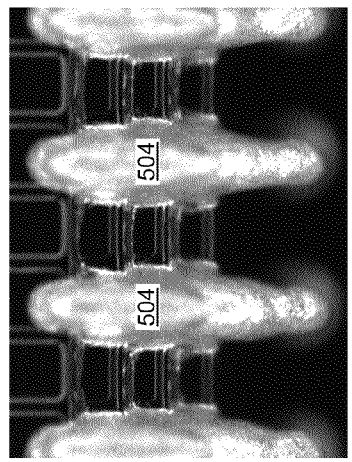
FIG. 12B is a plan view of part of a tiered offset stacked die assembly mounted on a support as in FIG. 12A, showing an electrical connection of the upper tier to the support.

FIGS. 12A, 12B, 12C, are partial views showing stages in the formation of the conductive traces 504 making die-to-die interconnection of the die in the second tier 422, and connection of the first tier 422 to the pedestals 502 on the bond pads 474 on the substrate.

Other embodiments are within the scope of the invention.

For example, the drawings show assemblies in which a tiered die stack (the upper offset die stack in these examples) is elevated over the support; and the pillars are deployed for electrical connection of an elevated offset die stack to bond pads on the support. In other contemplated embodiments the pillars are deployed for electrical connection of an elevated die or die stack (offset or not) to bond pads on the support. And, for example, the drawings show assemblies in which a lower offset die stack is situated between the upper stack and the support. Particularly, in the illustrated examples a lower offset die stack is mounted onto the support, and the upper stack is mounted on the lower stack, so that the elevation of the upper stack is imposed by the height of the lower stack over the substrate surface (or the height of the lower stack). In other contemplated embodiments the upper stack may be mounted over some feature other than a lower stack, such as, for example, a lower die or a lower non-offset die stack, or a package.

Also, for example, the illustrated zig-zag tiered die stack assemblies have two tiers (lower and upper), and each tier is shown as having four die. Assemblies having more than two tiers are contemplated, and tiers having other numbers of die are contemplated. For example, one or more additional tiers may be stacked over the second tier. And, for example, one or more of the tiers may have more or fewer than four die and, in some embodiments, one or more tiers may have eight die, for example.

Also, for example, the die in the upper and lower tiers are shown as having the same length. This circumstance may prevail where, for example, all the die are of the same type or have the same functionality. Each of the tiered stacks may, for example, include memory die of the same type. Other die types are contemplated. For example, die having different functionalities may be included within a tier; or, for example, the die in one tier may have the same functionality, while the die in another tier may have one or more different functionalities. Consequently, in some contemplated embodiments the die may not be the same size; or the die in one tier may be the same size, while die in another tier may have different dimensions.

Also, for example, the interconnect edge of the lowermost die in the upper tier is shown in the examples as extending outward beyond the underlying edge of the lower feature (that is, beyond the underlying die edge of the uppermost die in the lower tier in the examples shown). In other contemplated embodiments the interconnect edge of the upper stack may be vertically aligned with, or may lie inwardly from, the underlying edge of the lower feature.

Also, for example, in the illustrated examples the dielectric coating is shown as being removed from interconnect pads on all the die in the stacks. This allows contact of all the pads to a subsequently-formed trace. It may be desirable to form electrical connection with only selected ones of the pads. As illustrated and discussed in U.S. application Ser. No. 12/124, 077, referenced above and incorporated by reference herein, openings may be formed over selected ones of the pads in any die, or selected corresponding pads on successive die in the stack, leaving the remaining pads covered by the dielectric coating and unavailable for electrical connection. And, for example the coating is described as being formed in phases, with each phase following construction of each of the tiers. In some contemplated embodiments the coating is applied in a single phase following formation of two (or more). This may be particularly desirable where an upper tier is situated over a lower tier such that the interconnect die pads in the lower tier are readily available for removal (as for example, by laser ablation).

Also, for example, in the illustrated examples formation of the pillars and formation of the trace connecting the elevated (upper) die or the elevated (upper) die stack to the pillars are described as being carried out in two dispense operations. In some embodiments each pillar and corresponding trace may be formed in a continuous operation, by suitable control of the dispense and of the dispense tool.

We claim:

1. A semiconductor assembly comprising an elevated die mounted over and elevated above a support, said elevated die having a plurality of interconnect pads at a front side thereof, said support having pillars of a first electrically conductive material, each pillar on a respective bond pad at a mount side thereof, wherein the elevated die is electrically connected to the support by traces of a second electrically conductive material, each trace contacting each of at least two of said plurality of interconnect pads and the corresponding pillar on the corresponding bond pad, wherein said second electrically conductive material comprises a conductive material in particle form in a polymer matrix.

2. The assembly of claim 1 wherein the first electrically conductive material and the second electrically conductive material comprise the same material.

3. The assembly of claim 1 wherein at least one of said first electrically conductive material and said second electrically conductive material comprises a partially cured material.

4. The assembly of claim 1 wherein at least one of said first electrically conductive material and said second electrically conductive material comprises a curable material.

5. The assembly of claim 1 wherein at least one of said first electrically conductive material and said second electrically conductive material comprises a metal-filled polymer.

6. The assembly of claim 5 wherein the metal-filled polymer comprises a metal filled epoxy.

7. The assembly of claim 5 wherein the metal-filled polymer comprises a metal filled thermosetting polymer.

8. The assembly of claim 5 wherein the metal-filled polymer comprises a metal filled thermoplastic polymer.

9. The assembly of claim 1 wherein at least one of said first electrically conductive material and said second electrically conductive material comprises a conductive material in particle form in a carrier.

10. The assembly of claim 9 wherein at least one of said first electrically conductive material and said second electrically conductive material comprises an electrically conductive ink.

11. A semiconductor assembly comprising a plurality of die in a die stack mounted over a support, at least a first said die being elevated above the support, said first die having an interconnect pad at a front side thereof, said support having a pillar of a first electrically conductive material on a bond pad at a mount side thereof, wherein said first die is electrically connected to the support by a trace of a second electrically conductive material contacting the interconnect pad on the die to the pillar on the bond pad, wherein said second electrically conductive material comprises a conductive material in particle form in a polymer matrix, wherein at least a second said die is electrically connected to said first die by a trace of a third electrically conductive material contacting the interconnect pad on the first die with an interconnect pad on said second die.

12. The assembly of claim 11 wherein the first electrically conductive material and the second electrically conductive material comprise the same material.

13. The assembly of claim 11 wherein the third electrically conductive material and the second electrically conductive material comprise the same material.

14. The assembly of claim 11 wherein at least one of said first electrically conductive material and said second electrically conductive material comprises a partially cured material.

15. The assembly of claim 11 wherein at least one of said first electrically conductive material and said second electrically conductive material comprises a curable material.

16. The assembly of claim 11 wherein at least one of said first electrically conductive material and said second electrically conductive material comprises a metal-filled polymer.

17. The assembly of claim 16 wherein the metal-filled polymer comprises a metal filled epoxy.

18. The assembly of claim 16 wherein the metal-filled polymer comprises a metal filled thermosetting polymer.

19. The assembly of claim 16 wherein the metal-filled polymer comprises a metal filled thermoplastic polymer.

20. The assembly of claim 11 wherein at least one of said first electrically conductive material and said second electrically conductive material comprises a conductive material in particle form in a carrier.

21. The assembly of claim 20 wherein the electrically conductive material comprises an electrically conductive ink.

22. A semiconductor assembly comprising a plurality of die in an upper die stack mounted over and elevated above a support, at least a first die in said upper stack having an interconnect pad at a front side thereof, said support having a pillar of a first electrically conductive material on a bond pad at a mount side thereof, wherein said first die in said upper stack is electrically connected to the support by a trace of a second electrically conductive material contacting the interconnect pad on said first die in said upper stack to the pillar on the bond pad, wherein said second electrically conductive material comprises a conductive material in particle form in a polymer matrix wherein at least a second said die in said upper stack is electrically connected to said first die by a trace of a third electrically conductive material contacting the interconnect pad on the first die with an interconnect pad on said second die.

23. The semiconductor assembly of claim 22, further comprising a lower die situated between the support and the upper die stack.

24. The semiconductor assembly of claim 22, further comprising a lower die stack situated between the support and the upper die stack.

25. The semiconductor assembly of claim 24 wherein said lower die stack comprises a tiered offset stacked die assembly, and wherein die in the lower die stack are electrically interconnected die-to-die, and the lower die stack is electrically connected to a support by traces of an electrically conductive material contacting interconnect pads on the die of the lower die stack and a set of bond pads on the support.

26. The semiconductor assembly of claim 22, further comprising a semiconductor package situated between the support and the upper die stack.

27. The semiconductor assembly of claim 22 wherein the upper die stack comprises a tiered offset stacked die assembly in which interconnect edges of the die in the upper die stack face in a first direction and interconnect die pads are aligned with the pillar.

28. A die stack assembly comprising first and second tiered offset die stacks in a zig-zag configuration, a support having a first set of bond pads and a second set of bond pads, and a plurality of pillars projecting above and electrically connected with the second set of bond pads, wherein
   die in the first die stack being electrically interconnected die-to-die by first traces of electrically conductive material contacting interconnect pads on die of the first die stack and the first traces of electrically conductive material electrically connect the die in the first die stack with the first set of bond pads; and
   die in the second die stack being electrically interconnected die-to-die by second traces of electrically conductive material contacting interconnect pads on die of the second die stack and the second traces of electrically conductive material electrically connect the die in the second die stack with the pillars,
   wherein the electrically conductive material comprises a conductive material in particle form in a polymer matrix.

29. The die stack assembly of claim 28 wherein interconnect edges of the die in the first die stack face in a first direction, and interconnect edges of the die in the second die stack face in a second direction different from the first direction.

30. The die stack assembly of claim 28 wherein the first direction is opposite to the second direction.

31. The die stack assembly of claim 28 wherein the first direction is orthogonal to the second direction.

* * * * *